US012690422B2

(12) United States Patent (10) Patent No.: US 12,690,422 B2
Chuang et al. (45) Date of Patent: Jul. 21, 2026

(54) WAFER CARRIER

(71) Applicant: GLOBALWAFERS CO., LTD.,
Hsinchu City (TW)

(72) Inventors: Chih-Yuan Chuang, Hsinchu City
(TW); Jui-Pin Chen, Hsinchu City
(TW); Jia-Zhe Liu, Hsinchu City (TW)

(73) Assignee: GLOBALWAFERS CO., LTD.,
Hsinchu City (TW)

( * ) Notice: Subject to any disclaimer, the term of this
patent is extended or adjusted under 35
U.S.C. 154(b) by 312 days.

(21) Appl. No.: 18/413,984

(22) Filed: Jan. 16, 2024

(65) Prior Publication Data

US 2024/0249969 A1 Jul. 25, 2024

(30) Foreign Application Priority Data

Jan. 19, 2023 (TW) .................................. 112102767

(51) Int. Cl.
*H10P 72/76* (2026.01)
(52) U.S. Cl.
CPC ................................. *H10P 72/7611* (2026.01)
(58) Field of Classification Search
CPC ... H01P 72/7624; H01P 72/0482; H01P 72/78
See application file for complete search history.

(56) References Cited

U.S. PATENT DOCUMENTS 4,986,890 A * 1/1991 Setoyama ........... H10P 72/7624
204/298.11
5,376,213 A * 12/1994 Ueda ................... H10P 72/0441
156/345.53

| | | | | |
|---|---|---|---|---|
| 6,081,414 A * | 6/2000 | Flanigan | ........... | H01J 37/32532 |
| | | | | 279/128 |
| 8,800,484 B2 * | 8/2014 | Matsumoto | ......... | H10P 72/0462 |
| | | | | 118/723 AN |
| 8,992,686 B2 * | 3/2015 | Gomi | ................... | H10P 72/7624 |
| | | | | 118/724 |
| 9,765,433 B2 * | 9/2017 | Huang | ..................... | B23Q 1/25 |
| 11,171,008 B2 * | 11/2021 | Lee | ................... | H01J 37/32844 |
| 12,112,972 B2 * | 10/2024 | Liang | ................. | H10P 72/7624 |
| 12,512,358 B2 * | 12/2025 | Chadha | ................. | H10P 72/722 |
| 2002/0179245 A1 * | 12/2002 | Masuda | ............. | H10P 72/0421 |
| | | | | 156/345.1 |
| 2007/0181420 A1 * | 8/2007 | Wang | .................. | H10P 72/7616 |
| | | | | 204/298.02 |
| 2007/0187039 A1 * | 8/2007 | Chang | ................. | H10P 72/0421 |
| | | | | 156/345.48 |
| 2015/0228462 A1 * | 8/2015 | Yoshimura | ........ | H01J 37/32834 |
| | | | | 156/345.51 |
| 2017/0186634 A1 * | 6/2017 | Yanagisawa | ........ | H10P 72/0464 |
| 2019/0131163 A1 * | 5/2019 | Kuno | ................ | H01J 37/32431 |

* cited by examiner

*Primary Examiner* — Jason L Vaughan
(74) *Attorney, Agent, or Firm* — Birch, Stewart, Kolasch
& Birch, LLP

(57) ABSTRACT

A wafer carrier with a bottom for connecting to a shaft
includes a disc body and at least one heat insulator. The disc
body has an accommodating groove for accommodating a
wafer, and the disc body has a first surface and a second
surface opposing each other. A groove bottom of the accom-
modating groove has the first surface. The at least one heat
insulator is disposed on either the first surface or the second
surface. When the wafer is accommodated in the accommo-
dating groove, the at least one heat insulator is positioned
between the wafer and the shaft.

11 Claims, 9 Drawing Sheets

WAFER CARRIER

BACKGROUND OF THE INVENTION

Technical Field

The present invention relates generally to a wafer carrier device; and more particularly to a wafer carrier for use in a high-temperature chamber.

Description of Related Art

Many semiconductor devices are known to be formed through processing on wafers. Taking the example of an epitaxial process, a wafer needs to be disposed on a wafer carrier device and subjected to the deposition of relevant compounds, such as gallium nitride, in a high-temperature chamber.

A conventional wafer carrier device comprises a wafer carrier and a shaft, wherein a top of the wafer carrier is adapted to accommodate the wafer, and a bottom of the wafer carrier is connected to the shaft. During a process of epitaxial growth of the wafer, heating is typically required. However, due to the direct contact between the bottom of the wafer carrier and the shaft, thermal energy received by the wafer carrier tends to rapidly dissipate at a connection point between the bottom of the wafer carrier and the shaft. This leads to a lower temperature toward the connection point of the wafer carrier, causing uneven temperature distribution across the wafer carrier and affecting the overall temperature distribution of the wafer. Consequently, the quality of the epitaxy is poor. Therefore, addressing the pressing issue of providing a wafer carrier that enhances the uniformity of temperature distribution is crucial.

BRIEF SUMMARY OF THE INVENTION

In view of the above, the primary objective of the present invention is to provide a wafer carrier that enhances the uniformity of temperature distribution.

The present invention provides a wafer carrier with a bottom for connection to a shaft. The wafer carrier includes a disc body and at least one heat insulator. The disc body has an accommodating groove for accommodating a wafer, wherein the disc body has a first surface and a second surface opposing each other. A groove bottom of the accommodating groove has the first surface. The at least one heat insulator is disposed on either the first surface or the second surface. When the wafer is accommodated in the accommodating groove, the at least one heat insulator is positioned between the wafer and the shaft.

In an embodiment, the accommodating groove has an upper opening, a first groove section, and a second groove section. The first groove section is connected to the second groove section. A diameter of the first groove section is greater than a diameter of the second groove section. The first groove section has the upper opening and is for accommodating the wafer, and the second groove section has the first surface and is for accommodating the at least one heat insulator.

In an embodiment, the diameter of the first groove section and the diameter of the second groove section gradually taper from the groove bottom of the accommodating groove towards the upper opening.

In an embodiment, an angle between an inner wall of the first groove section and a horizontal reference plane parallel to the first surface, and an angle between an inner wall of the second groove section and the horizontal reference plane parallel to the first surface, are both greater than or equal to 70 degrees and are both less than or equal to 80 degrees.

In an embodiment, the at least one heat insulator includes a first heat insulator disposed on the first surface and accommodated in the second groove section. A center of the first heat insulator has a center thickness along a shaft direction, and an outer peripheral edge of the first heat insulator has an edge thickness along the shaft direction, wherein the center thickness is greater than the edge thickness.

In an embodiment, the second groove section has a height along the shaft direction. At a room temperature, the edge thickness of the first heat insulator is less than the height, and the center thickness of the first heat insulator is less than or equal to the height.

In an embodiment, the second groove section has a height along the shaft direction. At a high temperature, the edge thickness of the first heat insulator is less than or equal to the height, and the center thickness of the first heat insulator is greater than the height.

In an embodiment, the high temperature is greater than or equal to 900 degrees Celsius.

In an embodiment, the at least one heat insulator includes a second heat insulator. A bottom of the disc body has a recess for connecting to the shaft. The recess has the second surface, wherein the second heat insulator is disposed on the second surface.

In an embodiment, a thermal conductivity of the at least one heat insulator is less than a thermal conductivity of the disc body.

In an embodiment, a thermal conductivity of the wafer is between the thermal conductivity of the at least one heat insulator and the thermal conductivity of the disc body.

In an embodiment, a projection of the wafer, a projection of the at least one heat insulator, and a projection of a contact surface of the shaft contacting with the wafer carrier that are projected onto a horizontal reference plane parallel to the first surface, respectively have a wafer projection area, a heat insulator projection area, and a shaft projection area. The wafer projection area is greater than the heat insulator projection area, and the heat insulator projection area is greater than the shaft projection area.

The advantage of the present invention lies in the installation of the at least one heat insulator. When the wafer carrier is connected to the shaft, the thermal energy of the wafer carrier is less likely to transfer to the shaft and dissipate. This achieves the advantage of enhancing the uniformity of the overall temperature distribution of the wafer carrier during heating and ensuring even temperature distribution of the wafer accommodated in the accommodating groove.

BRIEF DESCRIPTION OF THE SEVERAL VIEWS OF THE DRAWINGS

The present invention would be best understood by referring to the following detailed description of some illustrative embodiments in conjunction with the accompanying drawings, in which.

DETAILED DESCRIPTION OF THE INVENTION

A wafer carrier 1 according to a first embodiment of the present invention is illustrated in FIG. 1 to FIG. 5 and includes a bottom to be connected to a shaft A. The wafer carrier 1 is a circular carrier, and the shaft A is disposed at a center of the wafer carrier 1. Therefore, when the wafer carrier 1 is disposed at the shaft A and connected to the shaft A, the shaft A could support the wafer carrier 1 or drive the wafer carrier 1 to rotate with the shaft A as a center of rotation.

In the current embodiment, the wafer carrier 1 is made of graphite material, and the shaft A is made of metal material. In other embodiments, the materials of the wafer carrier 1 and the shaft A are not limited to these.

Figure 1:
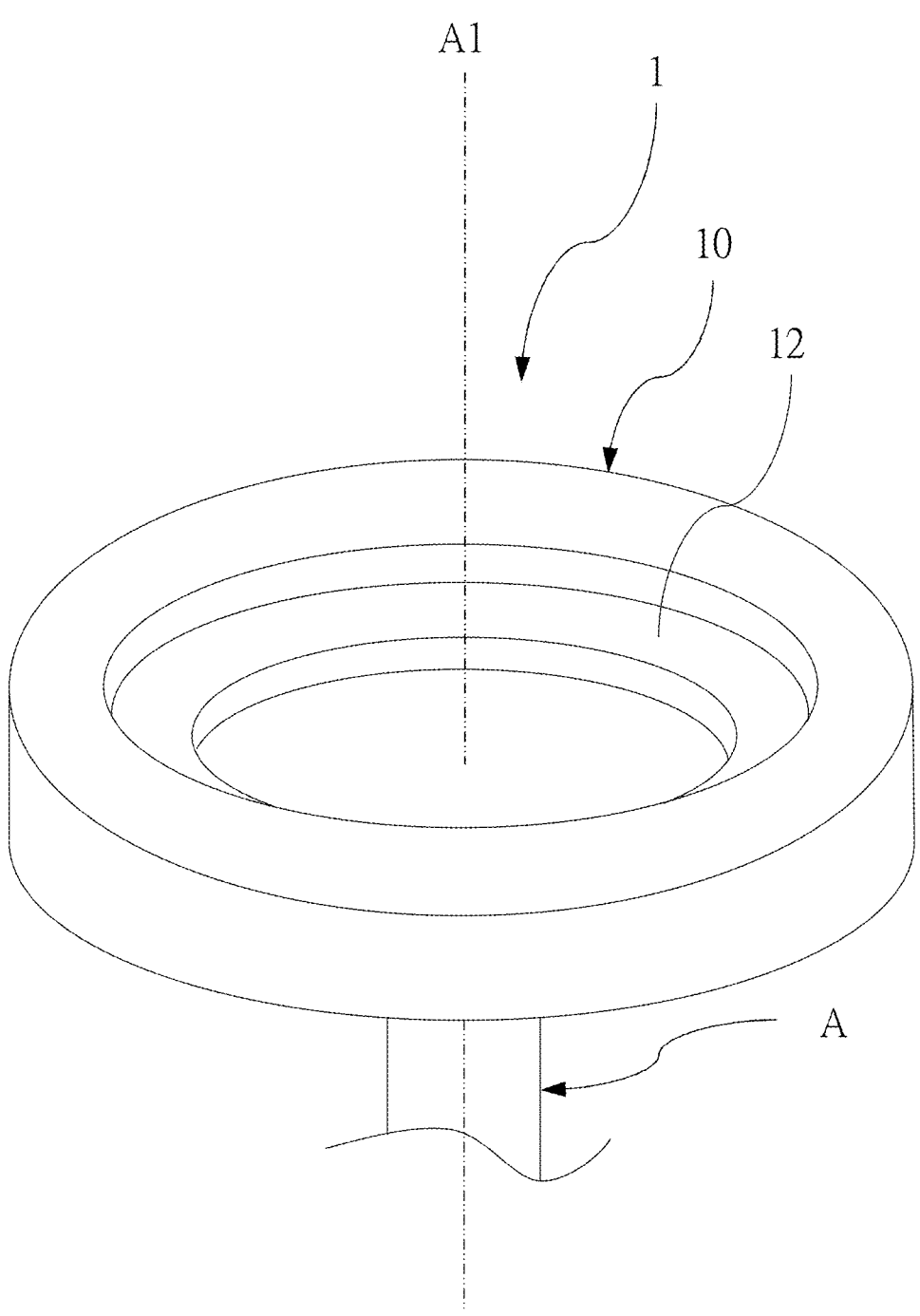
FIG. 1 is a perspective view of the wafer carrier according to a first embodiment of the present invention.
Figure 2:
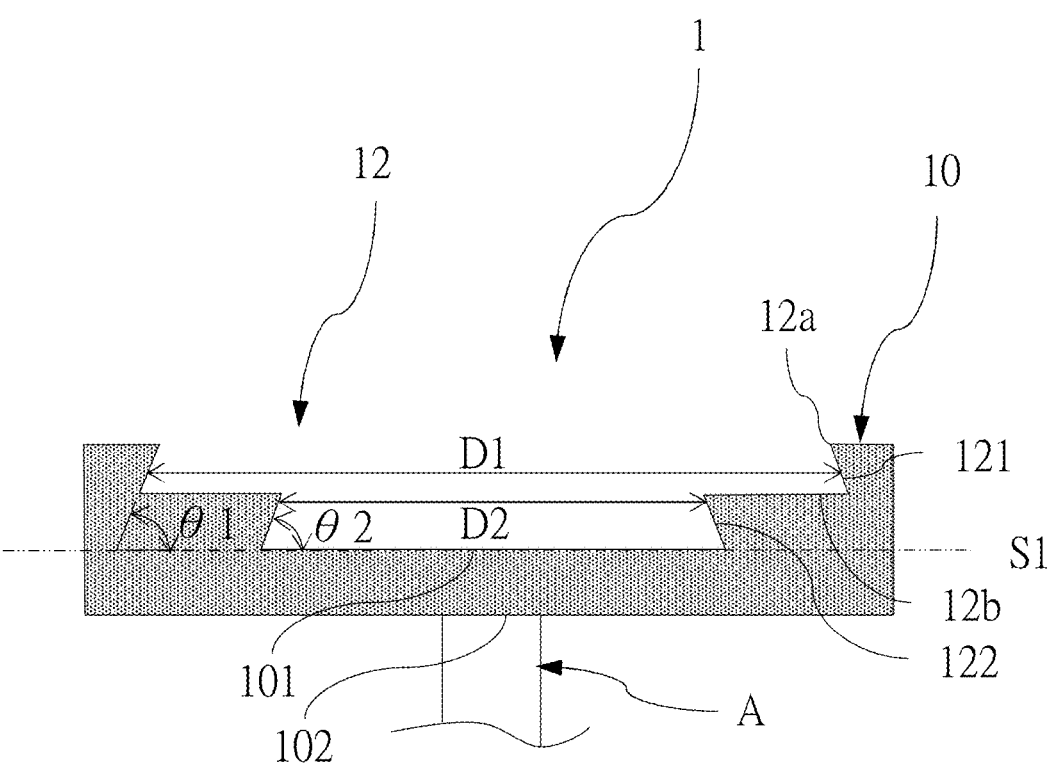
FIG. 2 is a sectional view of the wafer carrier according to the first embodiment of the present invention.
Figure 3:
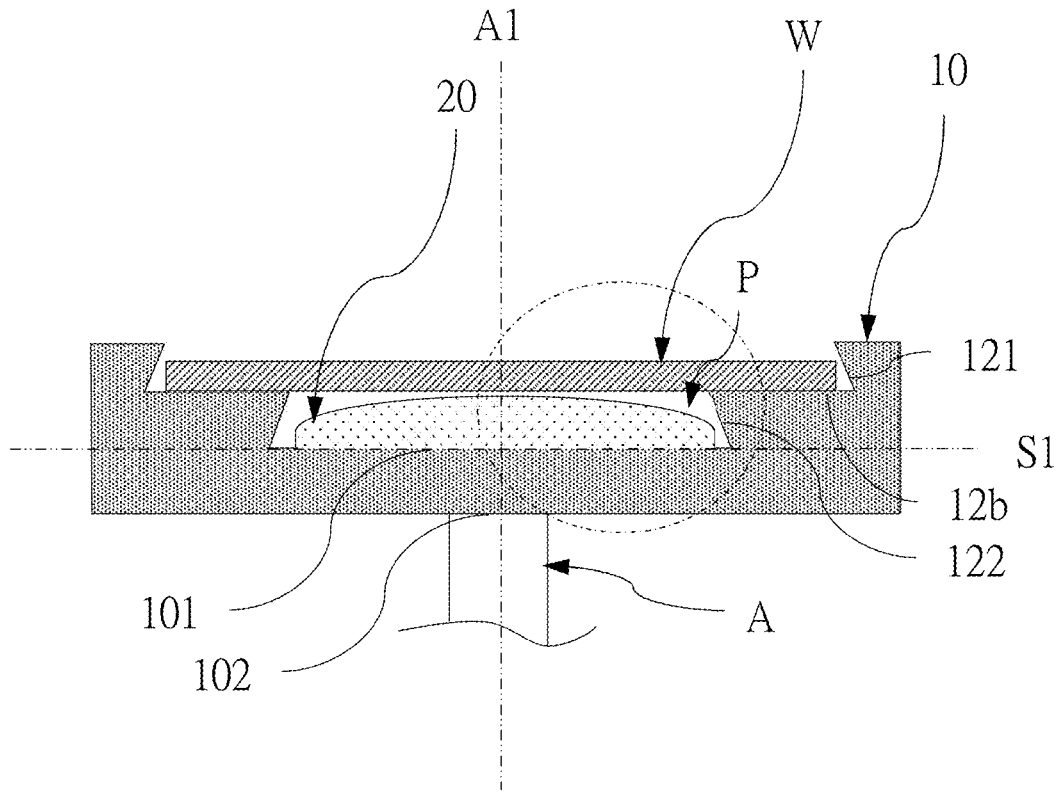
FIG. 3 is another sectional view of the wafer carrier according to the first embodiment of the present invention.

Referring to FIG. 1 to FIG. 3, the wafer carrier 1 includes a disc body 10 and a heat insulator. The wafer carrier 1 has an accommodating groove 12 for accommodating a wafer W. In the current embodiment, the accommodating groove 12 is illustrated as capable of accommodating a 12-inch wafer W. In other embodiments, the accommodating groove 12 could also be designed to accommodate a wafer W smaller than or larger than 12 inches.

Additionally, a thermal conductivity of the heat insulator is less than 151 W/(m·K), a melting point of the heat insulator is greater than 1300 degrees Celsius, and the heat insulator is made of quartz or sapphire. The thermal conductivity of the heat insulator is less than a thermal conductivity of the disc body 10, and a thermal conductivity of the wafer W is between the thermal conductivity of the heat insulator and the thermal conductivity of the disc body 10. In the current embodiment, the heat insulator is illustrated with a first heat insulator 20 as an example.

The disc body 10 has a first surface 101 and a second surface 102 opposing each other. The first surface 101 is disposed at a groove bottom of the accommodating groove 12, and the first heat insulator 20 is disposed on the first surface 101. When the wafer W is accommodated in the accommodating groove 12, the first heat insulator 20 is positioned between the wafer W and the shaft A. Therefore, during high temperature processes, through the installation of the first heat insulator 20, thermal energy of the wafer carrier 1 is less likely to transfer to the shaft A and dissipate, thereby enhancing the uniformity of overall temperature distribution of the wafer carrier 1 during heating. This ensures even temperature distribution of the wafer W accommodated in the accommodating groove 12.

Figure 3A:
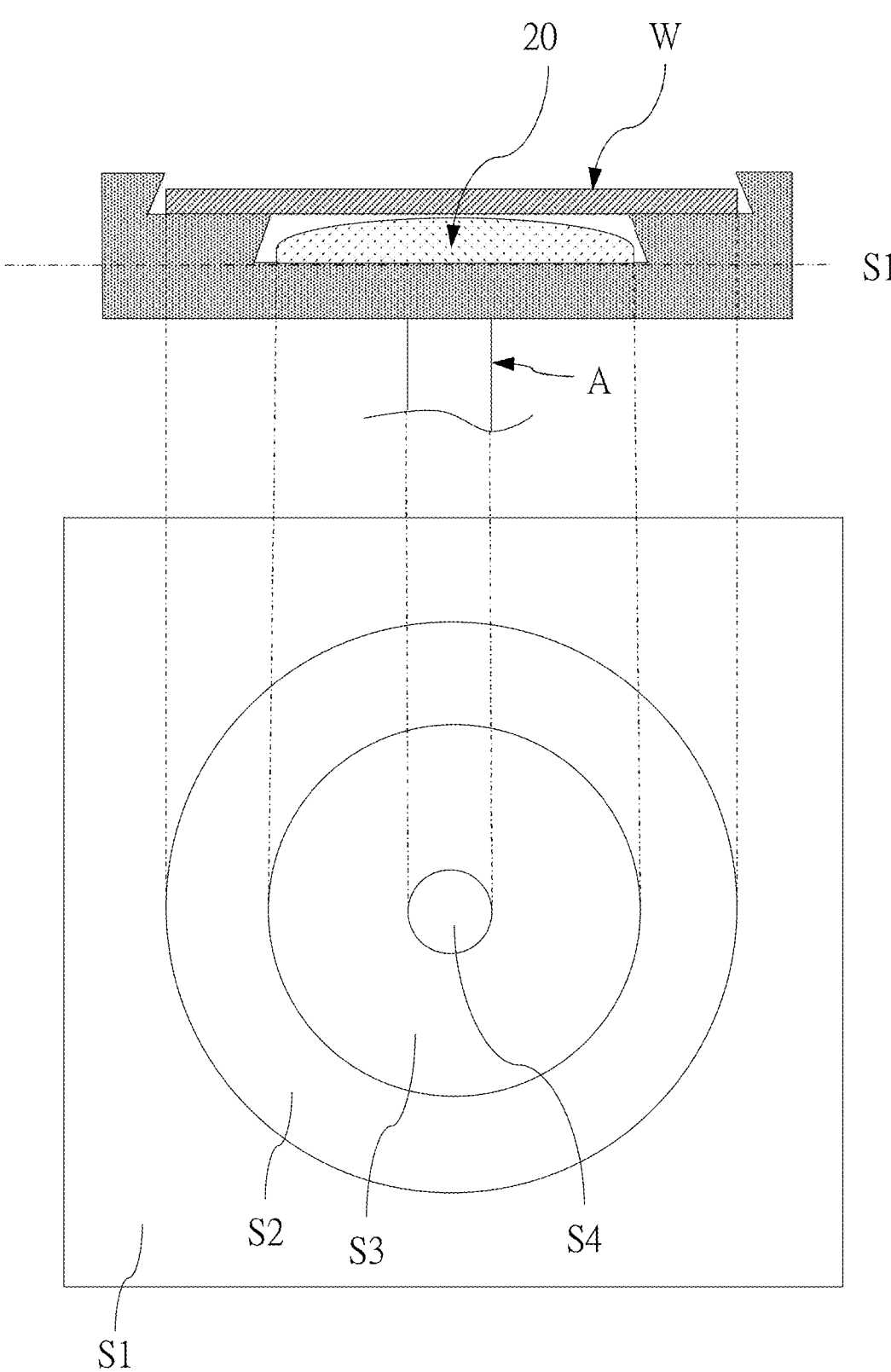
FIG. 3a is a schematic view, showing the wafer carrier projected onto a horizontal reference plane according to the first embodiment of the present invention.

A projection of the wafer W, a projection of the first heat insulator 20, and a projection of a contact surface of the shaft A contacting with the wafer carrier 1 that are projected onto a horizontal reference plane S1 parallel to the first surface 101 are shown in FIG. 3a and respectively have a wafer projection area S2, a heat insulator projection area S3, and a shaft projection area S4. The wafer projection area S2 is greater than the heat insulator projection area S3, and the heat insulator projection area S3 is greater than the shaft projection area S4. In other embodiments, the wafer projection area S2 could be equal to the heat insulator projection area S3, or the heat insulator projection area S3 could be equal to the shaft projection area S4.

Moreover, referring to FIG. 2, the accommodating groove 12 has an upper opening 12a, a first groove section 121, and a second groove section 122, wherein the first groove section 121 is connected to the second groove section 122. A diameter D1 of the first groove section 121 is greater than a diameter D2 of the second groove section 122. The first groove section 121 has the upper opening 12a and is for accommodating the wafer W, and the second groove section 122 has the first surface 101, wherein the second groove section 122 is designed to accommodate the first heat insulator 20.

In other words, the accommodating groove 12 has a shoulder 12b between the first groove section 121 and the second groove section 122 and for supporting the wafer W. When the wafer W is accommodated into the accommodating groove 12 from the upper opening 12a, an outer edge of a back of the wafer W contacts the shoulder 12b and is disposed in the first groove section 121. The back of the wafer W and the second groove section 122 together form a space P, as shown in FIG. 3, for placing the first heat insulator 20. When the first heat insulator 20 is disposed in the space P, the first heat insulator 20 is fitted against the first surface 101 of the second groove section 122 to block the thermal energy of the wafer carrier 1 from being transferred to the shaft A and being dissipated.

Referring to FIG. 2, the diameter D1 of the first groove section 121 and the diameter D2 of the second groove section 122 gradually taper from the groove bottom of the accommodating groove 12 towards the upper opening 12a. In other words, the diameter D1 of the first groove section 121 at a connection point between the first groove section 121 and the second groove section 122 is greater than a diameter of the upper opening 12a, and the diameter D2 of the groove bottom of the second groove section 122 is greater than a diameter of the second groove section 122 at a junction between the first groove section 121 and the second groove section 122. Therefore, the first heat insulator 20 and the wafer W could be stably placed in the accommodating groove 12. When the wafer carrier 1 rotates, the first heat insulator 20 and the wafer W in the accommodating groove 12 could be prevented from detaching from the wafer carrier 1.

Additionally, referring to FIG. 2, an angle $\theta1$ between an inner wall of the first groove section 121 and a horizontal reference plane S1 parallel to the first surface 101 is, preferably, greater than or equal to 70 degrees and less than or equal to 80 degrees. An angle $\theta2$ between an inner wall of the second groove section 122 and the horizontal reference plane S1 parallel to the first surface 101 is, preferably, greater than or equal to 70 degrees and less than or equal to 80 degrees.

Figure 4:
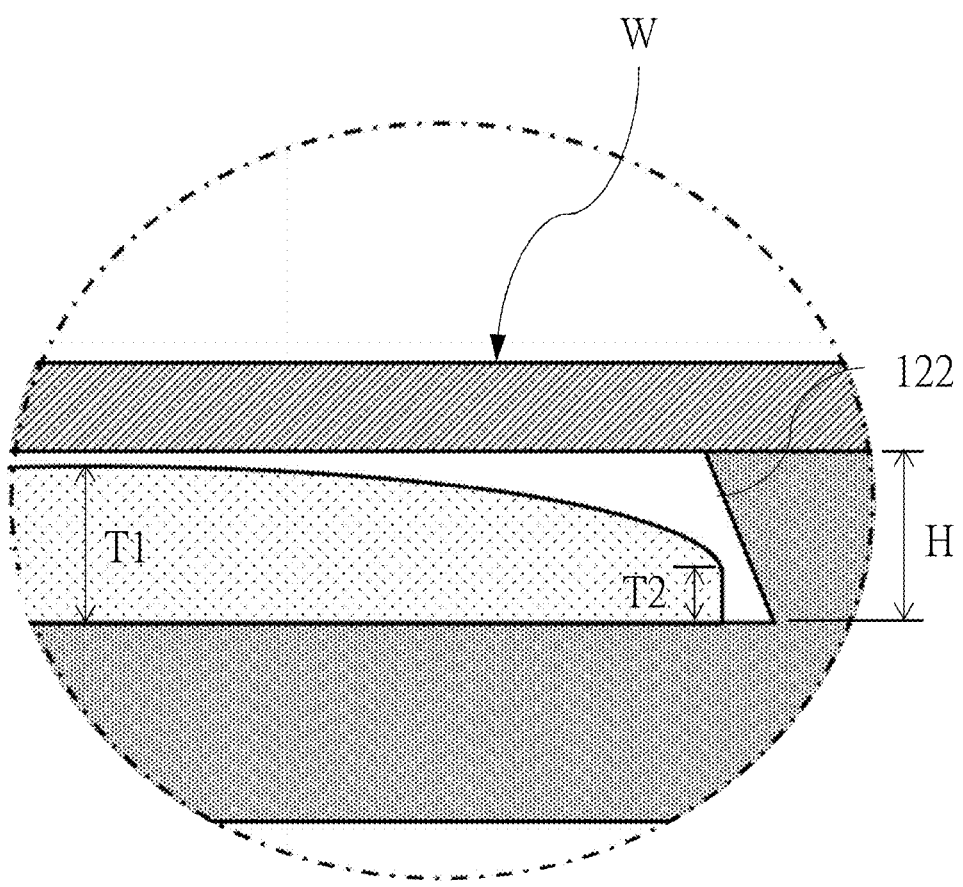
FIG. 4 is an enlarged schematic view of certain components in FIG. 3.

Referring to FIG. 3 and FIG. 4, the first heat insulator 20 is disposed on the first surface 101 and accommodated in the second groove section 122, and the wafer W is disposed in the first groove section 121. A center of the first heat insulator 20 has a center thickness T1 along a shaft direction A1 of the shaft A, and an outer peripheral edge of the first heat insulator 20 has an edge thickness T2 along the shaft direction A1. The center thickness T1 is greater than the edge thickness T2, so that the first heat insulator 20 could be compatible with the inclined inner wall of the second groove section 122, thereby preventing the first heat insulator 20 in the accommodating groove 12 from detaching from the wafer carrier 1 when the wafer carrier 1 rotates.

Figure 5:
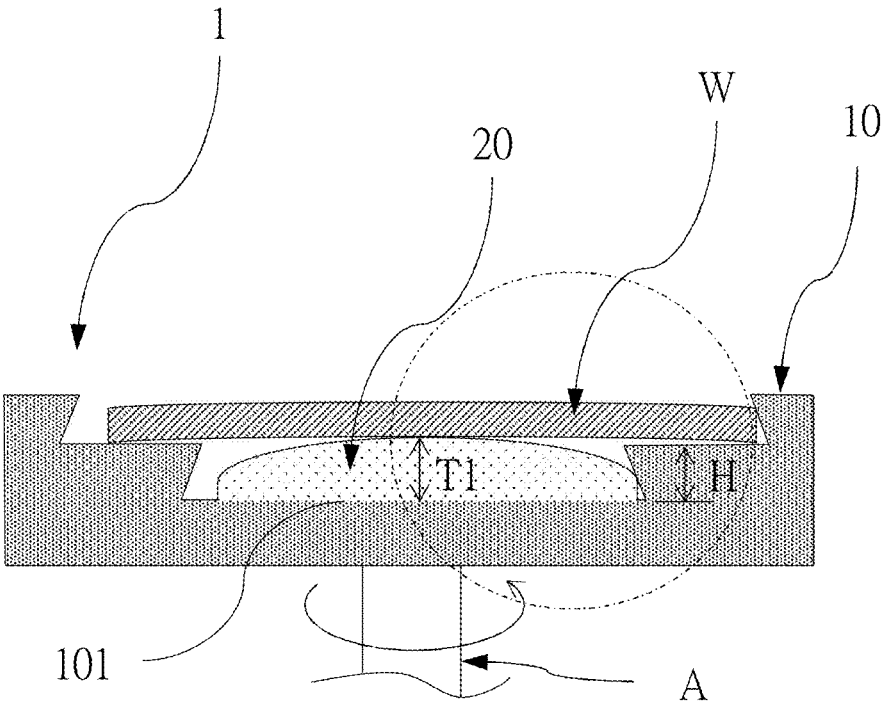
FIG. 5 is still another sectional view of the wafer carrier according to the first embodiment of the present invention.
Figure 6:
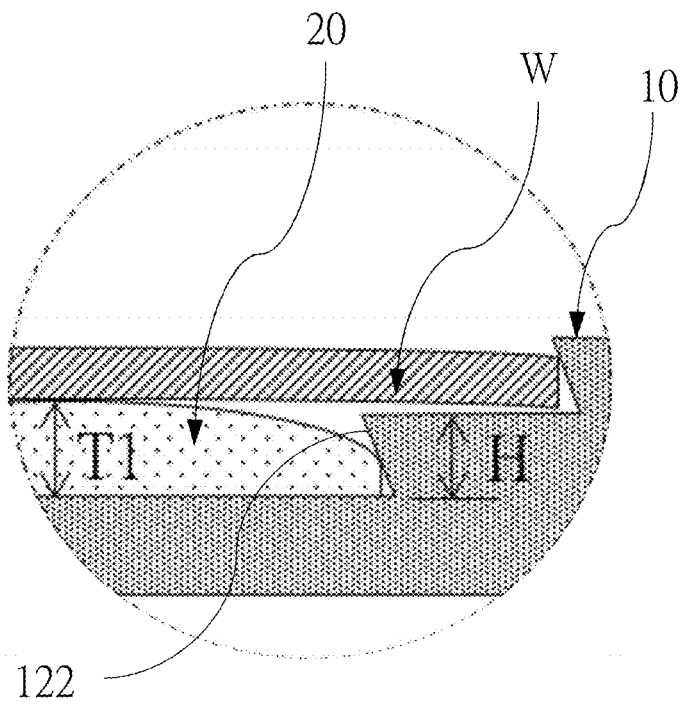
FIG. 6 is an enlarged schematic view of certain components in FIG. 5.

Furthermore, the second groove section 122 has a height H along the shaft direction A1. As shown in FIG. 4, at a room temperature, the edge thickness T2 of the first heat insulator 20 is less than the height H, and the center thickness T1 of the first heat insulator 20 is less than or equal to the height H. As shown in FIG. 5 and FIG. 6, at a high temperature, the edge thickness T2 of the first heat insulator 20 is less than or equal to the height H, and the center thickness T1 of the first heat insulator 20 is greater than the height H, wherein the high temperature is greater than or equal to 900 degrees Celsius. In other words, at the room temperature, there is a gap or just contact between the back of the wafer W and a top surface of the first heat insulator 20. At the high temperature, as shown in FIG. 5, the wafer W is prone to heat-induced warping. At this time, through a thermal expansion characteristic of the first heat insulator 20, a thickness of the center of the first heat insulator 20 could fill the gap between the back of the wafer W and the first heat insulator 20 to directly contact the wafer W.

As shown in FIG. 5 and FIG. 6, when the wafer carrier 1 rotates, the first heat insulator 20 and the wafer W that are disposed in the accommodating groove 12 would shift to a position where the first heat insulator 20 and the wafer W abut against the inner wall of the accommodating groove 12. At this point, the inner wall of the first groove section 121 and the inner wall of the second groove section 122 are inwardly inclined, along with the design of the thickness of the first heat insulator 20 and the height of the second groove section 122 as described above, as well as the design where a thickness of the wafer W is less than a height of the first groove section 121, so that the first heat insulator 20 or the wafer W could be effectively prevented from detaching from the accommodating groove 12.

Figure 7:
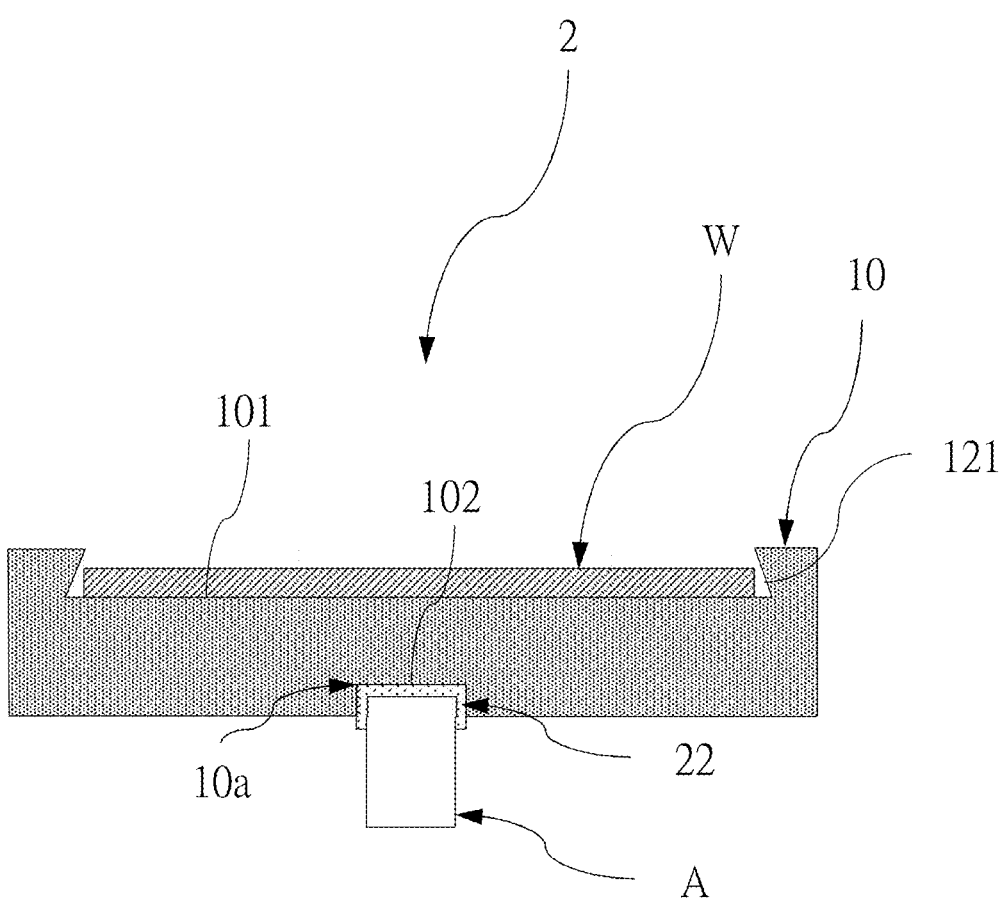
FIG. 7 is a sectional view of the wafer carrier according to a second embodiment of the present invention.

A wafer carrier 2 according to a second embodiment of the present invention is illustrated in FIG. 7 and has a structure almost the same as the wafer carrier 1 of the first embodiment except that the accommodating groove 12 of the wafer carrier 2 of the second embodiment only has the first groove section 121 and does not include the second groove section 122. Additionally, the heat insulator of the second embodiment is positioned different from the first heat insulator 20 of the first embodiment. In the second embodiment, the heat insulator is a second heat insulator 22 as an example.

The disc body 10 has the first surface 101 and the second surface 102 opposing each other. When the wafer W is accommodated in the first groove section 121, the first surface 101 contacts the wafer W. A bottom of the disc body 10 has a recess 10a for connecting to the shaft A, wherein the recess 10a has the second surface 102. The second heat insulator 22 is disposed on the second surface 102. Therefore, during high temperature processes, through the installation of the second heat insulator 22, thermal energy of the wafer carrier 2 is less likely to transfer to the shaft A and dissipate, thereby enhancing the uniformity of overall temperature distribution of the wafer carrier 2 during heating. This ensures even temperature distribution of the wafer W accommodated in the accommodating groove 12.

Figure 8:
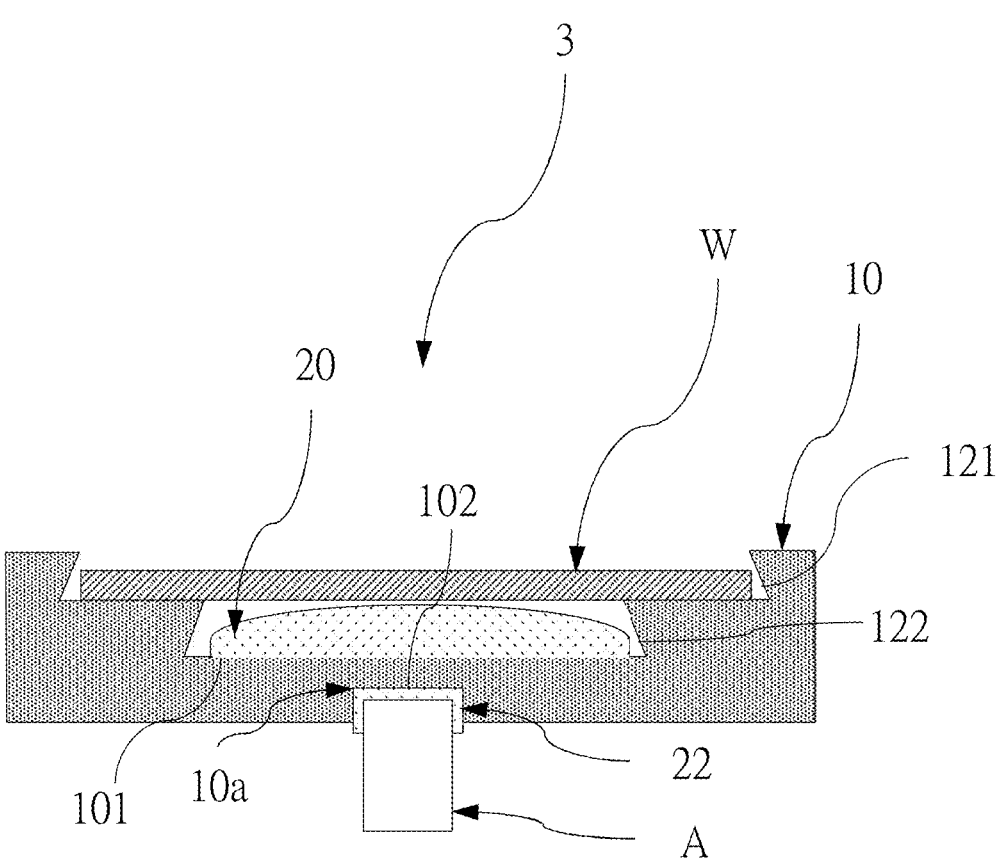
FIG. 8 is a sectional view of the wafer carrier according to a third embodiment of the present invention.

A wafer carrier 3 according to a third embodiment of the present invention is illustrated in FIG. 8 and has a structure almost the same as the wafer carrier 1 of the first embodiment and the wafer carrier 2 of the second embodiment mentioned above. The difference lies in the fact that, in the aforementioned embodiments, the heat insulator is illustrated using a single heat insulator as an example, but the heat insulator of the third embodiment could also include the first heat insulator 20 of the first embodiment and the second heat insulator 22 of the second embodiment, wherein the first heat insulator 20 and the second heat insulator 22 are separately disposed on the first surface 101 and the second surface 102 of the disc body 10, so that the transfer of thermal energy from the wafer carrier 3 to the shaft A to dissipate could be prevented.

In summary, through the disposal of the heat insulator according to the present invention, when the wafer carrier is connected to the shaft, the thermal energy of the wafer carrier is less likely to transfer to the shaft and dissipate. This achieves the advantage of enhancing the overall temperature distribution uniformity of the wafer carrier during heating and ensuring even temperature distribution of the wafer accommodated in the accommodating groove.

It must be pointed out that the embodiments described above are only some preferred embodiments of the present invention. All equivalent structures which employ the concepts disclosed in this specification and the appended claims should fall within the scope of the present invention.

What is claimed is:

1. A wafer carrier with a bottom for connecting to a shaft, comprising:
   a disc body having an accommodating groove for accommodating a wafer, wherein the disc body has a first surface and a second surface opposing each other; a groove bottom of the accommodating groove has the first surface; and
   at least one heat insulator disposed on either the first surface or the second surface;
   wherein when the wafer is accommodated in the accommodating groove, the at least one heat insulator is positioned between the wafer and the shaft, and
   wherein the accommodating groove comprises an upper opening, a first groove section, and a second groove section; the first groove section is connected to the second groove section; a diameter of the first groove section is greater than a diameter of the second groove section; the first groove section has the upper opening and is for accommodating the wafer, and the second groove section has the first surface and is for accommodating the at least one heat insulator.

2. The wafer carrier as claimed in claim 1, wherein the diameter of the first groove section and the diameter of the second groove section gradually taper from the groove bottom of the accommodating groove towards the upper opening.

3. The wafer carrier as claimed in claim 2, wherein an angle between an inner wall of the first groove section and a horizontal reference plane parallel to the first surface, and an angle between an inner wall of the second groove section and the horizontal reference plane parallel to the first surface are both greater than or equal to 70 degrees and are both less than or equal to 80 degrees.

4. The wafer carrier as claimed in claim 1, wherein the at least one heat insulator comprises a first heat insulator disposed on the first surface and accommodated in the second groove section; a center of the first heat insulator has a center thickness along a shaft direction, and an outer peripheral edge of the first heat insulator has an edge thickness along the shaft direction, wherein the center thickness is greater than the edge thickness.

5. The wafer carrier as claimed in claim 4, wherein the second groove section has a height along the shaft direction; at a room temperature, the edge thickness of the first heat insulator is less than the height, and the center thickness of the first heat insulator is less than or equal to the height.

6. The wafer carrier as claimed in claim 4, wherein the second groove section has a height along the shaft direction; at a high temperature, the edge thickness of the first heat insulator is less than or equal to the height, and the center thickness of the first heat insulator is greater than the height.

7. The wafer carrier as claimed in claim 6, wherein the high temperature is greater than or equal to 900 degrees Celsius.

8. The wafer carrier as claimed in claim 1, wherein the at least one heat insulator comprises a second heat insulator; a bottom of the disc body has a recess for connecting to the shaft; the recess has the second surface, wherein the second heat insulator is disposed on the second surface.

9. The wafer carrier as claimed in claim 1, wherein a thermal conductivity of the at least one heat insulator is less than a thermal conductivity of the disc body.

10. The wafer carrier as claimed in claim 9, wherein a thermal conductivity of the wafer is between the thermal conductivity of the at least one heat insulator and the thermal conductivity of the disc body.

11. The wafer carrier as claimed in claim 1, wherein a projection of the wafer, a projection of the at least one heat insulator, and a projection of a contact surface of the shaft contacting with the wafer carrier that are projected onto a horizontal reference plane parallel to the first surface, respectively have a wafer projection area, a heat insulator projection area, and a shaft projection area; the wafer projection area is greater than the heat insulator projection area, and the heat insulator projection area is greater than the shaft projection area.

* * * * *